United States Patent [19]
Bagley

[11] Patent Number: 6,111,528
[45] Date of Patent: Aug. 29, 2000

[54] COMMUNICATIONS ARRANGEMENTS FOR NETWORK DIGITAL DATA PROCESSING SYSTEM

[75] Inventor: Norman J. Bagley, Wakefield, Mass.

[73] Assignee: EMC Corporation, Hopkinton, Mass.

[21] Appl. No.: 08/474,235

[22] Filed: Jun. 7, 1995

[51] Int. Cl.⁷ .................................................. H03M 7/00
[52] U.S. Cl. .............................................. 341/58; 341/59
[58] Field of Search ................... 341/58, 59, 95, 341/106; 360/40

[56] References Cited

U.S. PATENT DOCUMENTS

| | | | |
|---|---|---|---|
| 4,486,739 | 12/1984 | Franaszek et al. | 340/347 DD |
| 4,499,454 | 2/1985 | Shimada | 340/347 |
| 4,675,652 | 6/1987 | Machado | 340/347 |
| 5,177,484 | 1/1993 | Cideciyan et al. | 341/59 |

*Primary Examiner*—Marc S. Hoff
*Assistant Examiner*—Peguy JeanPierre
*Attorney, Agent, or Firm*—Richard A. Jordan; Mark J. Casey; John M. Gunther

[57] ABSTRACT

Arrangements are disclosed for use in a network of digital data processing systems for rapidly encoding information signals for transmission over communication links in the network, and for rapidly decoding information received thereover, thereby to facilitate higher-bandwidth communications over the network. In addition, network command and control information transmitted along in the data transmitted over the network is rapidly decoded and verified by a command decoder and command verifier.

16 Claims, 5 Drawing Sheets

COMMUNICATIONS ARRANGEMENTS FOR NETWORK DIGITAL DATA PROCESSING SYSTEM

FIELD OF THE INVENTION

The invention relates generally to the field of digital data processing systems and more particularly to arrangements for facilitating the rapid encoding and decoding of data and commands which are transmitted over a network.

BACKGROUND OF THE INVENTION

In modern "enterprise" digital data processing systems, that is, computer systems for use in an office environment in a company, a number of personal computers, workstations, and other devices such as mass storage subsystems, network printers and interfaces to the public telephony system, are typically interconnected in a computer network. The personal computers and workstations are used by individual workers to perform processing in connection with data and programs that may be stored in the network mass storage subsystems; the personal computers/workstations, operating as clients, download the data and programs from the network mass storage subsystems process the data in connection with the programs and enable the processed data to be uploaded to the network mass storage subsystems for storage, to a network printer for printing, or to the telephony interface for transmission over the public telephony system. In such an arrangement, the network mass storage subsystems, network printers and telephony interface operate as servers, since they are available to service requests from all of the clients in the network. By organizing the network in such a manner, the servers are readily available for use by all of the personal computers/workstations in the network. Such a network may be spread over a fairly wide area, with the personal computers/workstations being interconnected by communication links such as electrical wires or optic fibers.

When designing a network, it is generally desirable to maximize the bandwidth which is available to transmit information over the network. For communications media such as optical fibers or copper wires, the effective bandwidth is very high. However, to effectively utilize the bandwidth that may be provided by the communications medium, appropriately-fast circuitry is preferably provided for generating the signals to be transmitted, and for receiving and decoding signals that are received.

SUMMARY OF THE INVENTION

The invention provides new and improved arrangements for use in connection with a digital network for facilitating the rapid encoding and decoding of data and commands which are transmitted over the network.

In brief summary, in accordance with one aspect of the invention an encoding system is provided for encoding data words which may be transmitted over the network. Each word comprises a series of data bytes. The encoding system encodes the data words in accordance with a predetermined encoding methodology in which each data byte is encoded in connection with the data byte and an encoding control signal generated during processing of a preceding data byte in the series, the signal having at least two conditions. The encoding system includes a plurality of encoding sections, each associated with a selection circuit. Each encoding section is associated with one of the data bytes. Each encoding section has a plurality of encoding circuits for receiving the data bytes in parallel, along with a signal corresponding to one of the possible conditions of the encoding control signal, and generates in response encoded bytes and an encoding control signal. In that operation, all of the encoding circuits operate in parallel. Each of the selection circuits selects the encoded byte and encoding control signal of one of the encoding circuits in the associated section, the selection circuit selecting the encoding circuit in response to the selected encoding control signal generated for the preceding data byte in the series. Since the encoding circuits operate in parallel on the bytes of each word, the encoding system will perform the encoding of each word more rapidly than if the encodings were performed serially.

In another aspect, the invention provides a decoding system for decoding encoded words, each encoded word comprising a series of encoded bytes, in accordance with a predetermined decoding methodology in which each encoded byte is decoded in connection with the encoded byte and a decoding control signal generated during processing of a preceding decoded byte in the series, the signal having at least two conditions. The decoding system includes a plurality of decoding sections and associated selection circuits. Each decoding section is associated with one of the encoded bytes, and has a plurality of decoding circuits for receiving the encoded bytes in parallel and a signal corresponding to one of the possible conditions of the decoding control signal and for generating a decoded data byte and a decoding control signal in parallel. Each selection circuit is associated with a decoding section, and selects the data byte and decoding control signal of one of the decoding circuits in the associated section. Each selection circuit selects the decoding circuit in response to the selected decoding control signal generated for the preceding data byte in the series.

In yet another aspect, the invention provides a command decoder for decoding a word, comprising a series of bytes, to determine whether the word defines a command. The command decoder comprises a plurality of byte decoders and a command consolidation circuit. Each of the byte decoders is associated with a byte, and generates a plurality of command encode signals in response to those patterns of the respective bytes of a word which constitute commands. The command consolidation circuit receives the encode signals from the byte decoders and generating respective command signals in response to corresponding patterns of the encode signals which constitute commands.

In a further aspect, the invention provides a command verifier for verifying reception of a command received over a network, the command being verified in response to receipt of the command in a predetermined number of successive messages received over the network. The command verifier comprises a series of registers, a comparator and an arrangement for enabling command execution. The series of registers stores commands in the predetermined number of successive messages received over the network. The comparator compares the contents of the registers to determine whether their contents are identical. The a command execution enabler enables the execution of the last-received command contained in the registers in response to a positive determination by the comparator.

In yet another aspect, the invention provides a method of encoding data words, each word comprising a series of data bytes, in accordance with a predetermined encoding methodology in which each data byte is encoded in connection with the data byte and an encoding control signal generated during processing of a preceding data byte in the series, the signal having at least two conditions. In accordance with the method, a plurality of encoding sections are provided, each associated with one of the data bytes, each encoding section having a plurality of encoding circuits for receiving the data bytes in parallel and a signal corresponding to one of the possible conditions of the encoding control signal and for generating encoded bytes and an encoding control signal in parallel. From each section, the encoded byte and encoding control signal of one of the encoding circuits in the associated section is selected, with the selection being made in response to the selected encoding control signal generated for the preceding data byte in the series.

In yet another aspect, the invention provides a method of decoding encoded words, each word comprising a series of encoded bytes, in accordance with a predetermined decoding methodology in which each encoded byte is decoded in connection with the encoded byte and a decoding control signal generated during processing of a preceding encoded byte in the series, the signal having at least two conditions. In accordance with the method, a plurality of decoding sections are provided, each associated with one of the encoded bytes, each decoding section having a plurality of decoding circuits for receiving the data bytes in parallel and a signal corresponding to one of the possible conditions of the decoding control signal and for generating decoded bytes and a decoding control signal in parallel. From each section, the decoded byte and decoding control signal of one of the decoding circuits in the associated section is selected, with the selection being made in response to the selected decoding control signal generated for the preceding encoded byte in the series.

In yet another aspect, the invention provides a method for decoding a word, comprising a series of bytes, to determine whether the word defines a command. In accordance with the method, for each byte a plurality of command encode signals are generated in response to those patterns of the respective bytes of a word which constitute commands. The encode signals are received from the byte decoders and respective command signals are generated in response to corresponding patterns of the encode signals which constitute commands.

Finally, in another aspect, the invention provides a method for verifying reception of a command received over a network, the command being verified in response to receipt of the command in a predetermined number of successive messages received over the network. In accordance with the method, commands are stored in the predetermined number of successive messages received over the network in a series of registers. The contents of the registers are compared to determine whether their contents are identical, and the execution of the last-received command contained in the registers is enabled in response to a positive determination during the comparison.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
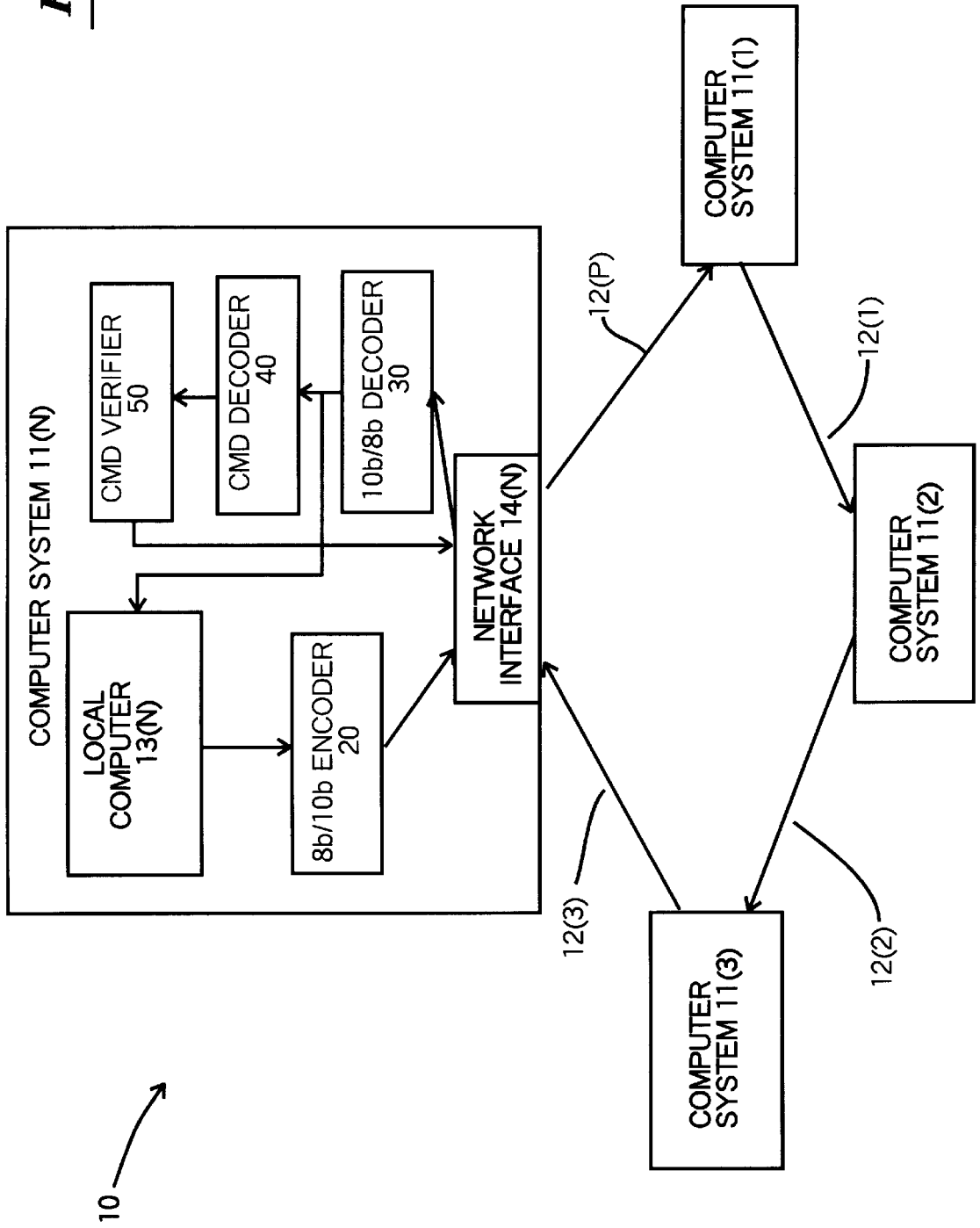
FIG. 1 is a functional block diagram of a computer network constructed in accordance with the invention.

FIG. 1 is a general schematic diagram of a computer network 10 constructed in accordance with the invention. With reference to FIG. 1, the computer network includes a plurality of computer systems 11(1) through 11(N) (generally identified by reference numeral 11($n$)) which are interconnected by communication links 12(1) through 12(N) (generally identified by reference numeral 12($n$)). In the embodiment depicted in FIG. 1, the computer network 10 is in the form of a ring topology, so that each communication link 12($n$) connects the correspondingly indexed computer system 11($n$) to computer system 11($n$+1) in a point-to-point manner, although it will be appreciated that the invention may be used in connection with networks of other topologies. In addition, in one embodiment the communication links 12($n$) are in the form of optical fibers, over which communications proceed serially, although it will be appreciated that other media may also be used.

The computer systems 11($n$) depicted in FIG. 1 may all generally be similar. An illustrative computer system 11($n$) includes a conventional computer 13($n$), including a local processor (not separately shown) which performs processing operations in connection with data and instructions stored in a local memory and local mass storage device (also not separately shown). In addition, the computer may also include operator input devices such as a keyboard and/or mouse device which allow an operator to input data and control information for controlling processing, a display device such as a video display for displaying status and processed data to the operator, and a local printer for generating hardcopy output.

The illustrative computer system 11($n$) will also include a network interface 14($n$) which interfaces the computer 13 to the communication links 12($n$) and 12($n$−1) to facilitate communications with other computer systems in the network 10. Information is transferred over the network in the form of messages, with each message including an address, identifying the computer system 11($n$) to receive the message, and data. The network interface 14($n$) will include arrangements for transmitting messages over communication link 12($n$) to the next computer system 11($n$+1) in the system, and for receiving messages over communication link 12($n$−1) from the preceding computer system 11($n$−1) in the system. When the network interface 14($n$) receives a message the address will be decoded to determine whether it identifies the computer system 11($n$), and if so the message will be received and the data coupled to the local computer 13($n$) for processing. On the other hand, if a message received by the network interface 14($n$) has an address which identifies another computer system in the network 10, the message from the communication link 12($n$−1) will be coupled to the next communication link 12($n$) for transfer the message to the next computer system 12($n$+1).

Although the network 10 has been described as including a number of computer systems 11($n$), it will be appreciated that a number of types of systems may be connected in the network 10, including, for example, mass storage subsystems such as disk or tape devices for storing data or programs which may be accessed by one or a number of computer systems 11(n) in the network 10, interfaces to other networks or the public telecommunications systems, hardcopy output devices such as network printers, and the like.

The invention provides a number of arrangements for enhancing communications in the network 10. In particular, the invention provides arrangements for rapidly encoding information signals for transmission over a communication link and for rapidly decoding information received thereover, thereby to facilitate higher-bandwidth communications over the network. An encoder 20 and a decoder 30, described in detail below in connection with FIGS. 2 and 3, respectively, are provided to perform the encoding and decoding operations. In addition, since, in one embodiment, network command and control information are transmitted in the data transmitted over the network, the invention provides for the rapid decoding and verification of the commands. A command decoder 40 and command verifier 50, described below in connection with FIGS. 4 and 5, respectively, are provided to perform the command decoding and verification operations.

Figure 2:
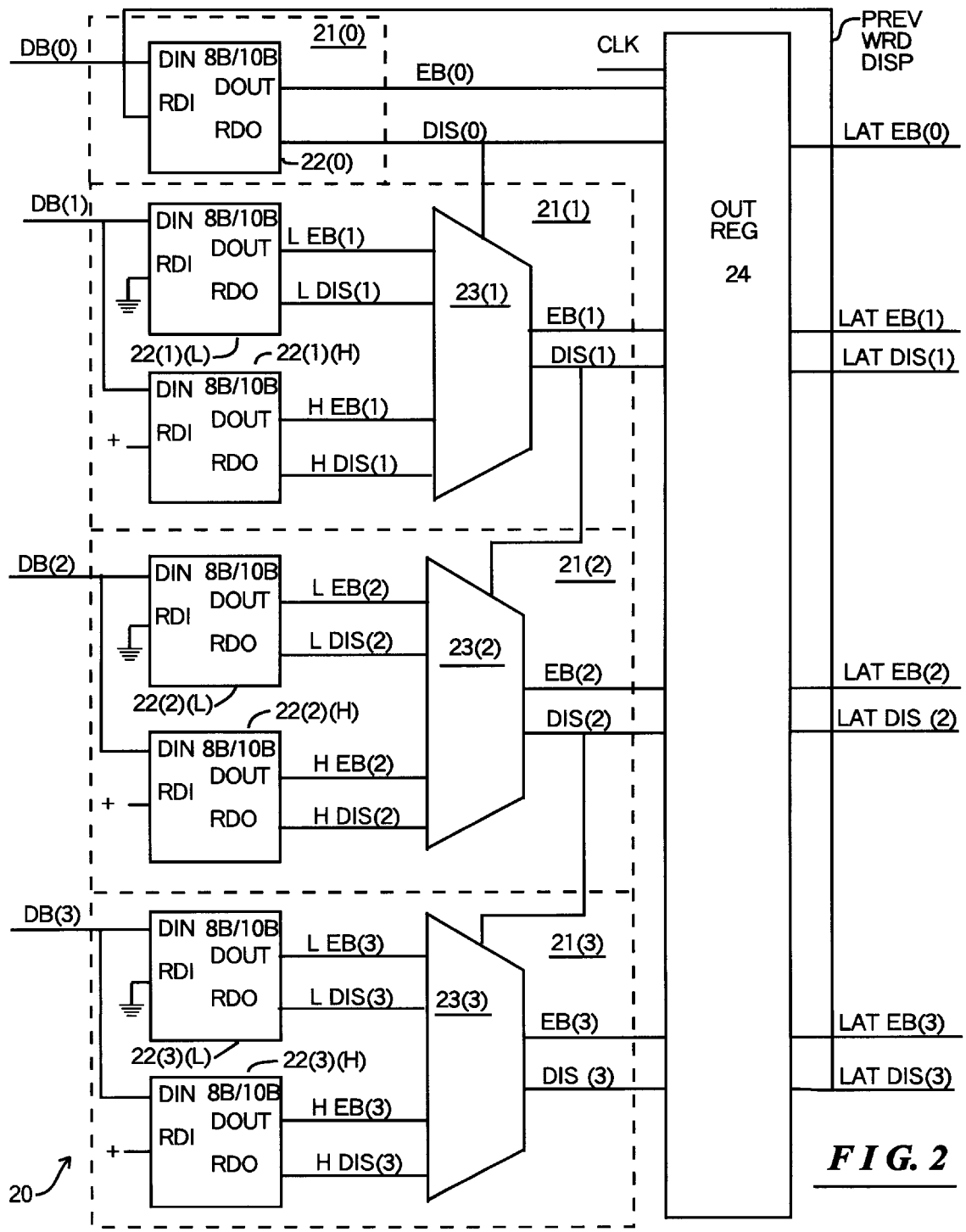
FIG. 2 is a schematic logic diagram of an encoding circuit for encoding data and clocking information for use in information transmissions over the network depicted in FIG. 1.
Figure 3:
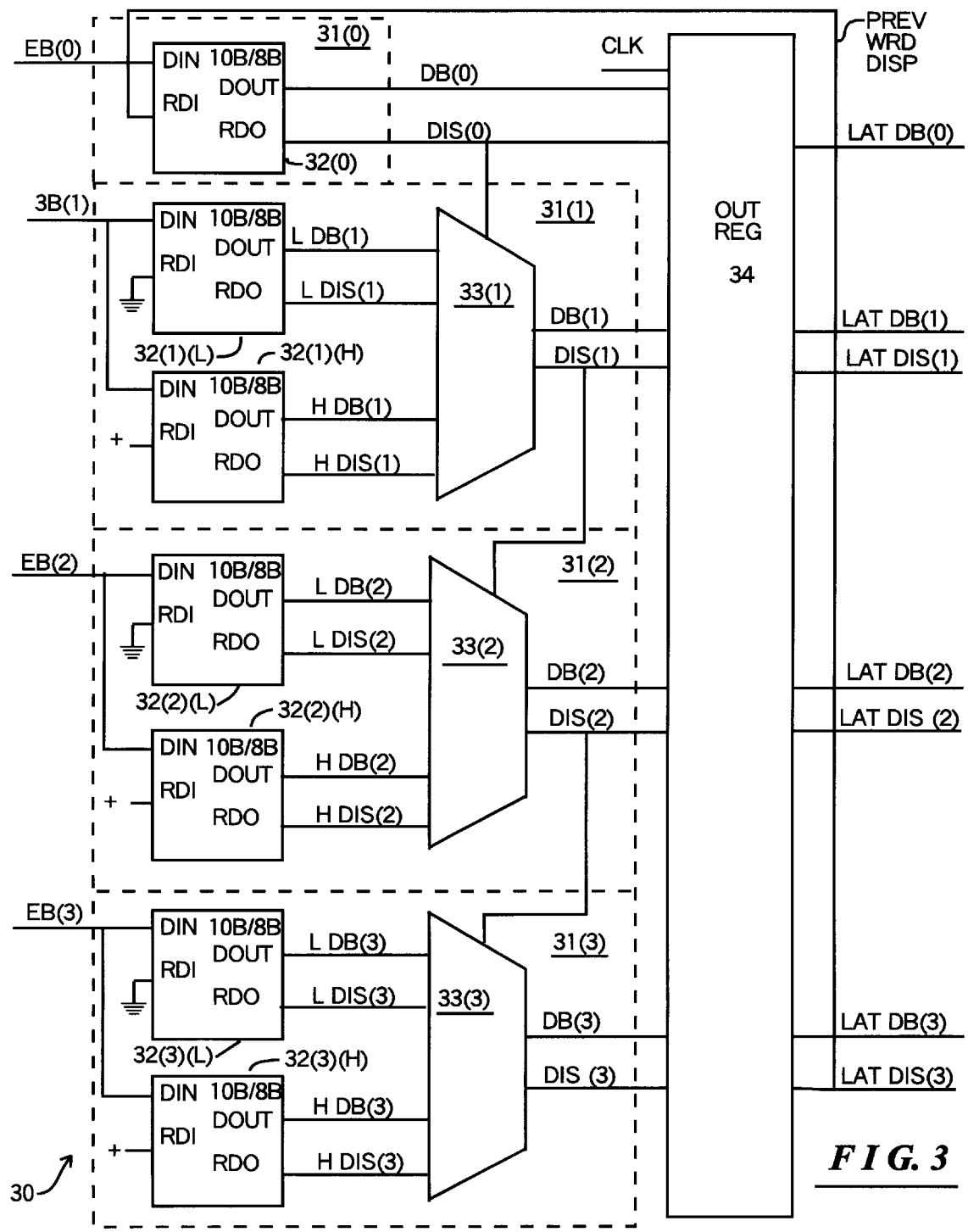
FIG. 3 is a decoding circuit useful in decoding the information transmissions to extract the data.

FIG. 2 is a schematic logic diagram of an encoding circuit 20 for encoding data and clocking information for use in information transmissions over the network depicted in FIG. 1, and FIG. 3 is a decoding circuit useful in decoding the information transmissions to extract the data. In one embodiment, useful in connection with a network constructed in accordance with the "Fibre Channel" message transfer protocol, in which information is transmitted serially over each respective communication link 13(p) (FIG. 1), eight-bit bytes of data are expanded to ten bits to facilitate the provision of clocking/timing information along with the data. One arrangement for performing this so-called 8b/10b encoding and decoding operation is disclosed in U.S. Pat. No. 4,486,739 issued Dec. 4, 1984 to P. Franaszek, et al., entitled "Byte Oriented DC Balanced (0,4) 8B/10B Partitioned Block Transmission Code." The encoding and decoding operation will not be described in detail except to note that encoding for each byte will result in generation of a disparity bit which will be used in encoding of the succeeding byte. Accordingly, the 8b/10b encoding of each data byte DB(n) (after the first byte) in a byte stream will be generated from the byte DB(n) itself and the "encode" disparity DIS(n–1) bit generated during encoding of the preceding data byte DB(n–1). In addition, the 8b/10b encoding of data byte DB(n) will result in generation of an encode disparity bit DIS(n–1) which will be used in generating the 8b/10b encoding of the next data byte DB(n+1) in the byte stream.

Similar operations occur during a decode operation, in which ten successive bits received over the network are decoded to form an eight-bit decoded data byte. In a decode operation, the 10b/8b decoded (eight-bit) data byte will be generated from the encoded (ten-bit) "byte" EB(n) and a decode disparity DEC DIS(n–1) is generated during decoding of the preceding encoded "byte" EB(n–1). In addition, during decoding of an encoded "byte," a decode disparity bit DEC DIS(n) is generated which will be used in decoding the next encoded "byte" EB(n+1) in the data stream.

FIG. 2 depicts an encoding circuit 20, for use with a network interface 14(n) of a computer system 11(n), for performing an encoding operation in connection with data to generate an encoding in connection with the 8b/10b encoding methodology for transmission over the communication link 12(n) connected thereto. FIG. 3 depicts a decoding circuit 30 for performing a decoding operation in connection with encoded words received over the communication link 12(n–1) to generate decoded eight-bit data bytes to be provided to local computer 13(n) for further processing. The encoding circuit 20 depicted in FIG. 2, instead of encoding data bits in eight-bit data bytes, performs encoding in connection with data bits in thirty-two bit data words, to generate forty-bit encoded "words" for transmission over the communication link 12(n), while performing the 8b/10b encoding operation within each eight-bit byte of the thirty-two bit data word. Similarly, the decoding circuit 30, instead of decoding ten-bit encoded "bytes" received from the communication link 12(n–1) to generate eight-bit data bytes, operates to decode forty-bit encoded "words" received from the communication link 12(n–1) to generate thirty-two-bit data words, which are used by the local computer 13(n) for processing. By operating in connection with units of thirty-two bits/forty bits instead of eight bits/ten bits, the encoding and decoding circuits 20 and 30 perform respective encoding and decoding operations more rapidly, so that data can be transferred over the respective communication links 13(n–1) and 13(n) more rapidly.

More specifically, with reference to FIG. 2, the encoding circuit 20 includes a plurality of 8b/10b encoder circuits divided into a plurality of encoder circuit sections 21(0) through 21(3) (generally identified by reference numeral 21(i)), each encoder circuit section 21(i) being associated with a correspondingly-indexed one of the eight-bit data bytes DB(0) through DB(3) (generally identified "DB(i)") of a thirty-two bit data word provided by the local computer 13(n) for transmission over the communication link 12(n). Generally, the data bytes in each word, after encoding, will be transmitted over the communication link 12(n) successively from the low-order byte DB(0) to the high-order byte DB(3). The encoder circuit section 21(0), which receives the low-order data byte DB(0), includes a single 8b/10b encoder circuit 22(0). The encoder circuit 22(0) receives the signals defining an eight-bit low-order data byte DB(0) at data input terminals D IN and a PREV WRD DISP previous word disparity signal (generated as described below) at a disparity input terminal DIS IN, and generates therefrom signals defining a ten-bit encoded byte EB(0) at data out terminals DOUT and a low-order disparity signal DIS(0) at a disparity signal output terminal DISOUT.

Each of the other encoder circuit sections 21(1) through 21(3) includes two encoder circuits 22(i)(L) and 22(i)(H) (index "i" from 1 to 3) and a multiplexer 23(i). Each encoder circuit 22(i)(L) and 22(i)(H) also includes data input terminals DIN through which it receives the correspondingly-indexed eight-bit data byte DB(i). In addition, each encoder circuit 22(i)(L) and 22(i)(H) includes a disparity input terminal DIS IN, with the DIS IN disparity input terminals of the encoder circuits 22(i)(L) receiving a low (negated) input signal and the DIS IN disparity input terminals of the encoder circuits 22(i)(H) receiving a high (asserted) input signal. Thus, each encoder circuit 22(i)(L) generates an eight-bit/ten-bit encoded byte L EB(i), which it provides at its respective data out terminals DOUT, based on the data byte DB(i) received at its data in terminals DIN and the negated signal received at its disparity signal input terminal DIS IN. In addition, each encoder circuit 22(i)(L) generates a disparity signal L DIS(i) which it provides at its disparity output terminal DIS OUT. Similarly, each encoder circuit 22(i)(H) generates an eight-bit/ten-bit encoded byte H EB(i), which it provides at its respective data out terminals DOUT, based on the data byte DB(i) received at its data in terminals DIN and the asserted signal received at its disparity signal input terminal DIS IN, and in addition provides a disparity signal H DIS(i) which it provides at its disparity output terminal DIS OUT. Thus, each encoder circuit 22(i)(L) effectively generates the encoded byte L EB(i) and disparity signal L DIS(i) based on the assumption that the disparity signal provided for the previous data byte DB(i-1) would be negated, whereas each encoder circuit 22(i)(H) effectively generates the encoded byte H EB(i) and disparity signal H DIS(i) based on the assumption that the disparity signal provided for the previous data byte DB(i-1) would be asserted.

Each multiplexer 23(i) is provided to select either the L EB(i) encoded byte and L DIS(i) disparity signal provided by encoder circuit 22(i)(L), or the H EB(i) encoded byte and the H DIS(i) disparity signal provided by encoder circuit 22(i)(H), of the correspondingly-indexed circuit section 21(i). Multiplexer 23(1) of an encoder circuit section 21(1) is controlled by the disparity signal DIS(0) generated by lower-order encoder section 21(0) and operates to couple either the L EB(1) encoded byte and L DIS(1) disparity signal provided by encoder circuit 22(1)(L), or the H EB(1) encoded byte and the H DIS(1) disparity signal provided by encoder circuit 22(1)(H), as the EB(1) encoded byte and DIS(1) disparity signal for the data byte DB(1). The multiplexer 23(1) couples the L EB(1) encoded byte and the L DIS(1) disparity signal provided by the encoder circuit 22(1)(L) as the EB(1) encoded byte and DIS(1) disparity signal if the DIS(0) disparity signal from the lower-order encoder section 21(0) is negated. Conversely, the multiplexer 23(1) couples the H EB(1) encoded byte and the H DIS(1) disparity signal provided by the encoder circuit 22(1)(H) as the EB(1) encoded byte and DIS(1) disparity signal if the DIS(0) disparity signal from the lower-order encoder section 21(0) is asserted. Accordingly, instead of actually using the disparity signal DIS(0) from the lower-order encoder section 21(0) in performing the 8b/10b encoding for the next data byte DB(1), the encoder section 21(1) includes encoder circuits 22(1)(L) and 22(1)(H) for generating the 8b/10b encoding for both the asserted and negated condition for the disparity signal DIS(0) and the multiplexer 23(1) selects the proper encoding based on the condition of the disparity signal DIS(0).

Similarly, multiplexer 23(i) (index "i" here corresponding to "2" or "3") of a circuit section 21(i) is controlled by the disparity signal DIS(i-1) generated by encoder section 21(i-i) and operates to couple either the L EB(i) encoded byte and L DIS(i) disparity signal provided by encoder circuit 22(i)(L), or the H EB(i) encoded byte and the H DIS(i) disparity signal provided by encoder circuit 22(i)(H), as the EB(i) encoded byte and DIS(i) disparity signal for the data byte DB(i). The multiplexer 23(i) couples the L EB(i) encoded byte and the L DIS(i) disparity signal provided by the encoder circuit 22(i)(L) as the EB(i) encoded byte and DIS(i) disparity signal if the DIS(i-1) disparity signal from the encoder section 21(i-1) is negated. Conversely, the multiplexer 23(i) couples the H EB(i) encoded byte and the H DIS(i) disparity signal provided by the encoder circuit 22(i)(H) as the EB(i) encoded byte and DIS(i) disparity signal if the DIS(i-1) disparity signal from the lower-order encoder section 21(i-1) is asserted. Accordingly, instead of actually using the disparity signal DIS(i-1) from the lower-order encoder section 21(i-1) in performing the 8b/10b encoding for the next data byte DB(i), the encoder section 21(i) includes encoder circuits 22(i)(L) and 22(i)(H) for generating the 8b/10b encoding for both the asserted and negated condition for the disparity signal DIS(i-1) and the mutiplexer 23(i) selects the proper encoding based on the condition of the disparity signal DIS(i-1).

The outputs of all of the encoder circuit sections 21(i) are connected to an output register 24, which serves to receive and, in response to a tick of a CLK clock signal, store the encoded bytes EB(i) and disparity signals DIS(i) coupled thereto by encoder circuit 22(0) of section 21(0) and the various multiplexers 23(i) (index "i" from "1" to "3") of the various sections 21(i). Thus, the output register 24 stores the forty-bit encoded word and the disparity signals. The stored disparity signal generated by encoder circuit section 21(3) is coupled to the disparity input terminal DIS IN of the encoder circuit 22(0) and is used thereby in performing the 8b/10b encoding.

In operation, each thirty-two bit data word, comprising four eight-bit data bytes DB(i) are provided to the inputs of respective encoder circuit sections 21(i) in parallel. In the encoder circuit sections 21(i), the respective encoder circuits 22(0), 22(i)(L) and 22(i)(H) receive the respective data bytes in parallel and perform an encoding operation in connection therewith and in connection with the signal at their respective disparity input terminals DIS IN. (For the first data word, the disparity signal provided by the output register 24 at the disparity input terminal for encoder circuit 22(0) will be negated.) Thus, all of the encoder circuits will operate to generate encoded bytes and disparity signals in parallel. The disparity signal DIS(0) from encoder circuit section 21(0) will operate to enable the multiplexer 23(1) to selectively couple either the L EB(1) encoded byte and L DIS(1) disparity signal from encoder circuit 22(1)(L) or the H EB(1) encoded byte and H DIS(1) disparity signal from encoder circuit 22(1)(H) as the EB(1) encoded byte and DIS(1) disparity signal to the output register 24 for storage. After the multiplexer 23(1) couples the disparity signal DIS(1), that signal will, in turn, control the multiplexer 23(2) to operate as described above. When multiplexer 23(2) in turn operates to couple the DIS(2) disparity signal, the multiplexer 23(3) will be controlled to operate as described above. Thus, each multiplexers 23(1) through 23(3) will be controlled successively by the DIS(i) signal coupled by the preceding multiplexer. At the next tick of the CLK clock signal, the output register 24 will be enabled to store the encoded bytes for transmission over the communication link 12(n), as well as the respective disparity signals.

These operations are repeated for each thirty-two bit word provided to the encoder 20. As noted above, for the first word, the disparity signal coupled by output register 24 to the disparity input terminal DIS IN of encoder circuit 22(0) is assumed to have a predetermined negated condition. It will be appreciated, however, that, for encodings of successive thirty-two bit data words after the first data word, the condition of the disparity signal provided to the disparity input terminal DIS IN of encoder circuit 22(1) will correspond to the condition of the stored disparity signal generated by encoder section 21(3) for the preceding data word, thereby preserving the 8b/10b encoding scheme as between the last data byte DB(3) of one data word and the first data byte DB(0) of the next data word. Since, as described above, the encoder circuits 22(0), 22(i)(L) and 22(i)(H) operate in parallel, the encoder 20 can perform its encoding operations more rapidly than if the data bytes DB(i) are encoded serially.

The decoder 30 is constructed and operates in a similar manner as encoder 20. As described above, in a decode operation, the 10b/8b decoded (eight-bit) data byte will be generated from the encoded (ten-bit) "byte" EB(n) and a decode disparity DEC DIS(n-1) generated during decoding of the preceding encoded "byte" EB(n−1). In addition, during decoding of an encoded "byte," a decode disparity bit DEC DIS(n) is generated which will be used in decoding the next encoded "byte" EB(n+1) in the data stream. With reference to FIG. 3, the decoding circuit 30 includes a plurality of 10b/8b decoder circuits divided into a plurality of decoder circuit sections 31(0) through 31(3) (generally identified by reference numeral 31(i)), each decoder circuit section 31(i) being associated with a correspondingly-indexed one of the encoded bytes EB(0) through EB(3) (generally identified "EB(i)") of a forty-bit encoded word provided by the interface 14. Generally, the encoded bytes in each word, were received from the communication link 12(n) successively from the lower-order byte EB(0) to the high-order byte EB(3). The decoder circuit section 31(0), which receives the lower-order encoded byte EB(0), includes a single 10b/8b decoder circuit 32(0). The decoder circuit 32(0) receives the signals defining an ten-bit lower-order encoded byte EB(0) at data input terminals D IN and a PREV WRD DISP previous word disparity signal (generated as described below) at a disparity input terminal DIS IN, and generates therefrom signals defining an eight-bit data byte DB(0) at data out terminals DOUT and a lower-order disparity signal DIS(0) at a disparity signal output terminal DISOUT.

Each of the other decoder circuit sections 31(1) through 31(3) includes two decoder circuits 32(i)(L) and 32(i)(H) (index "i" from 1 to 3) and a multiplexer 33(i). Each decoder circuit 32(i)(L) and 32(i)(H) also includes data input terminals DIN through which it receives the correspondingly-indexed ten-bit encoded byte EB(i). In addition, each decoder circuit 32(i)(L) and 32(i)(H) includes a disparity input terminal DIS IN, with the DIS IN disparity input terminals of the decoder circuits 32(i)(L) receiving a low (negated) input signal and the DIS IN disparity input terminals of the decoder circuits 32(i)(H) receiving a high (asserted) input signal. Thus, each decoder circuit 32(i)(L) generates a ten-bit/eight-bit data byte L DB(i), which it provides at its respective data out terminals DOUT, based on the encoded byte EB(i) received at its data in terminals DIN and the negated signal received at its disparity signal input terminal DIS IN. In addition, each decoder circuit 32(i)(L) generates a disparity signal L DIS(i) which it provides at its disparity output terminal DIS OUT. Similarly, each decoder circuit 32(i)(H) generates a ten-bit/eight-bit data byte L DB(i), which it provides at its respective data out terminals DOUT, based on the encoded byte EB(i) received at its data in terminals DIN and the asserted signal received at its disparity signal input terminal DIS IN, and in addition provides a disparity signal H DIS(i) which it provides at its disparity output terminal DIS OUT. Thus, each decoder circuit 32(i)(L) effectively generates the decoded byte L DB(i) and disparity signal L DIS(i) based on the assumption that the disparity signal provided for the previous encoded byte EB(i−1) would be negated, whereas each decoder circuit 32(i)(H) effectively generates the data byte H DB(i) and disparity signal H DIS(i) based on the assumption that the disparity signal provided for the previous encoded byte EB(i−1) would be asserted.

Each multiplexer 33(i) is provided to select either the L DB(i) data byte and L DIS(i) disparity signal provided by decoder circuit 32(i)(L), or the H DB(i) data byte and the H DIS(i) disparity signal provided by decoder circuit 32(i)(H), of the correspondingly-indexed circuit section 31(i). Multiplexer 33(1) of a decoder circuit section 31(1) is controlled by the disparity signal DIS(0) generated by lower-order decoder section 31(0) and operates to couple either the L DB(1) data byte and L DIS(1) disparity signal provided by decoder circuit 32(1)(L), or the H DB(1) data byte and the H DIS(1) disparity signal provided by decoder circuit 32(1)(H), as the DB(1) data byte and DIS(1) disparity signal for the encoded byte EB(1). The multiplexer 33(1) couples the L DB(1) data byte and the L DIS(1) disparity signal provided by the decoder circuit 32(1)(L) as the DB(1) data byte and DIS(1) disparity signal if the DIS(0) disparity signal from the lower-order decoder section 31(0) is negated. Conversely, the multiplexer 33(1) couples the H DB(1) data byte and the H DIS(1) disparity signal provided by the decoder circuit 32(1)(H) as the DB(1) data byte and DIS(1) disparity signal if the DIS(0) disparity signal from the lower-order decoder section 31(0) is asserted. Accordingly, instead of actually using the disparity signal DIS(0) from the lower-order decoder section 31(0) in performing the 10b/8b decoding for the next encoded byte DB(1), the decoder section 31(1) includes decoder circuits 32(1)(L) and 32(1)(H) for generating the 10b/8b decoding for both the asserted and negated condition for the disparity signal DIS(0) and the multiplexer 33(1) selects the proper encoding based on the condition of the disparity signal DIS(0).

Similarly, multiplexer 33(i) (index "i" here corresponding to "2" or "3") of a decoder circuit section 31(i) is controlled by the disparity signal DIS(i−1) generated by decoder circuit section 31(i−i) and operates to couple either the L DB(i) data byte and L DIS(i) disparity signal provided by decoder circuit 32(i)(L), or the H DB(i) data byte and the H DIS(i) disparity signal provided by decoder circuit 32(i)(H), as the DB(i) data byte and DIS(i) disparity signal for the encoded byte EB(i). The multiplexer 33(i) couples the L DB(i) data byte and the L DIS(i) disparity signal provided by the decoder circuit 32(i)(L) as the DB(i) data byte and DIS(i) disparity signal if the DIS(i−1) disparity signal from the decoder section 31(i−1) is negated. Conversely, the multiplexer 33(i) couples the H DB(i) data byte and the H DIS(i) disparity signal provided by the decoder circuit 32(i)(H) as the DB(i) data byte and DIS(i) disparity signal if the DIS(i−1) disparity signal from the lower-order decoder section 31(i−1) is asserted. Accordingly, instead of actually using the disparity signal DIS(i−1) from the lower-order decoder section 31(i−1) in performing the 10b/8b decoding for the next encoded byte EB(i), the decoder section 31(i) includes decoder circuits 32(i)(L) and 32(i)(H for generating the 10b/8b decoding for both the asserted and negated condition for the disparity signal DIS(i−1) and the multiplexer 33(i) selects the proper decoding based on the condition of the disparity signal DIS(i−1).

The outputs of all of the decoder circuit sections 31(i) are connected to an output register 34, which serves to receive and, in response to a tick of a CLK clock signal, store the data bytes DB(i) and disparity signals DIS(i) coupled thereto by decoder circuit 32(0) of section 31(0) and the various multiplexers 33(i) (index "i" from "1" to "3") of the various sections 31(i). Thus, the output register 34 stores the thirty-two-bit data word and the disparity signals. The stored disparity signal generated by decoder circuit section 31(3) is coupled to the disparity input terminal DIS IN of the decoder circuit 32(0) and is used thereby in performing the 10b/8b decoding.

In operation, each forty-bit encoded word, comprising four ten-bit encoded bytes EB(i), are provided to the inputs of respective decoder circuit sections 31(i) in parallel. In the decoder circuit sections 31(i), the respective decoder circuits 32(0), 32(i)(L) and 32(i)(H) receive the respective encoded bytes in parallel and perform a decoding operation in connection therewith and in connection with the signal at their respective disparity input terminals DIS IN. (For the first encoded word, the disparity signal provided by the output register 34 at the disparity input terminal for decoder circuit 32(0) will be negated.) Thus, all of the decoder circuits 32(i) will operate to generate data bytes and disparity signals in parallel. The disparity signal DIS(0) from decoder circuit section 31(0) will operate to enable the multiplexer 33(1) to selectively couple either the L DB(1) data byte and L DIS(1) disparity signal from decoder circuit 32(1)(L) or the H DB(1) data byte and H DIS(1) disparity signal from decoder circuit 32(1)(H) as the DB(1) data byte and DIS(1) disparity signal to the output register 34 for storage. After the multiplexer 33(1) couples the disparity signal DIS(1), that signal will, in turn, control the multiplexer 33(2) to operate as described above. When multiplexer 33(2) in turn operates to couple the DIS(2) disparity signal, the multiplexer 33(3) will be controlled to operate as described above. Thus, each multiplexer 33(2) and 33(3) will be controlled successively by the DIS(i) signal coupled by the preceding multiplexer 33(1) and 33(2). At the next tick of the CLK clock signal, the output register 34 will be enabled to store the data bytes for transmission to the local computer 13(n), as well as the respective disparity signals.

These operations are repeated for each forty-bit encoded word provided to the decoder 30. As noted above, for the first word, the disparity signal coupled by output register 34 to the disparity input terminal DIS IN of decoder circuit 32(0) is assumed to have a predetermined negated condition. It will be appreciated, however, that, for decodings of successive forty-bit encoded words after the first encoded word, the condition of the disparity signal provided to the disparity input terminal DIS IN of decoder circuit 32(0) will correspond to the condition of the stored disparity signal generated by decoder section 31(3) for the preceding encoded word, thereby preserving the 10b/8b decoding scheme as between the last encoded byte EB(3) of one encoded word and the first encoded byte EB(0) of the next encoded word. Since, as described above, the decoder circuits 32(0), 32(i)(L) and 32(i)(H) operate in parallel, the decoder 30 can perform its decoding operations more rapidly than if the encoded bytes EB(i) are decoded serially.

While the encoder 20 is described as having four encoding sections 21(i) for encoding four eight-bit data bytes in parallel, it will be appreciated that it may be provided with more or fewer encoding sections for encoding words comprising respective numbers of data bytes in parallel. Regardless of the number of encoding sections 21(i) that are provided, the lower-order encoding section 21(0) will receive the latched disparity signal generated by the higher-order encoding section of the previous word. Similarly, while the decoder 30 is described as having four decoding sections 31(i) for decoding four eight-bit data bytes in parallel, it will be appreciated that it may be provided with more or fewer decoding sections for decoding words comprising respective numbers of data bytes in parallel. Regardless of the number of decoding sections 31(i) that are provided, the lower-order decoding section 31(0) will receive the latched disparity signal generated by the higher-order decoding section of the previous word.

In one particular embodiment, in which the encoding circuit 20 is used in connection with a Fibre Channel network, each of the 8b/10b encoding circuits 22(i) also operates in connection with a D/K signal (not shown), which indicates certain types of control information. In that embodiment, the 8b/10b encoding circuits 22(i)(j) (index "j" indicating "L" or "H") will generate encoded bytes EB(i) in connection with the D/K signal. Similarly, in one embodiment, in which the decoding circuit 30 is used in connection with a Fibre Channel network, each of the 10b/8b decoding circuits 32(i) will generate a D/K signal indicating certain types of control information, as well as an ERR error signal if the decoding circuit 32(i)(j) is unable to identify an eight-bit data byte in response to the ten-bit encoded byte provided thereto. In that case, the respective multiplexers 33(i) will select the D/K and ERR signals from the respective decoding circuits 32(i)(j) along with the respective decoded data bytes and disparity signals for latching by the output register 34.

Figure 4:
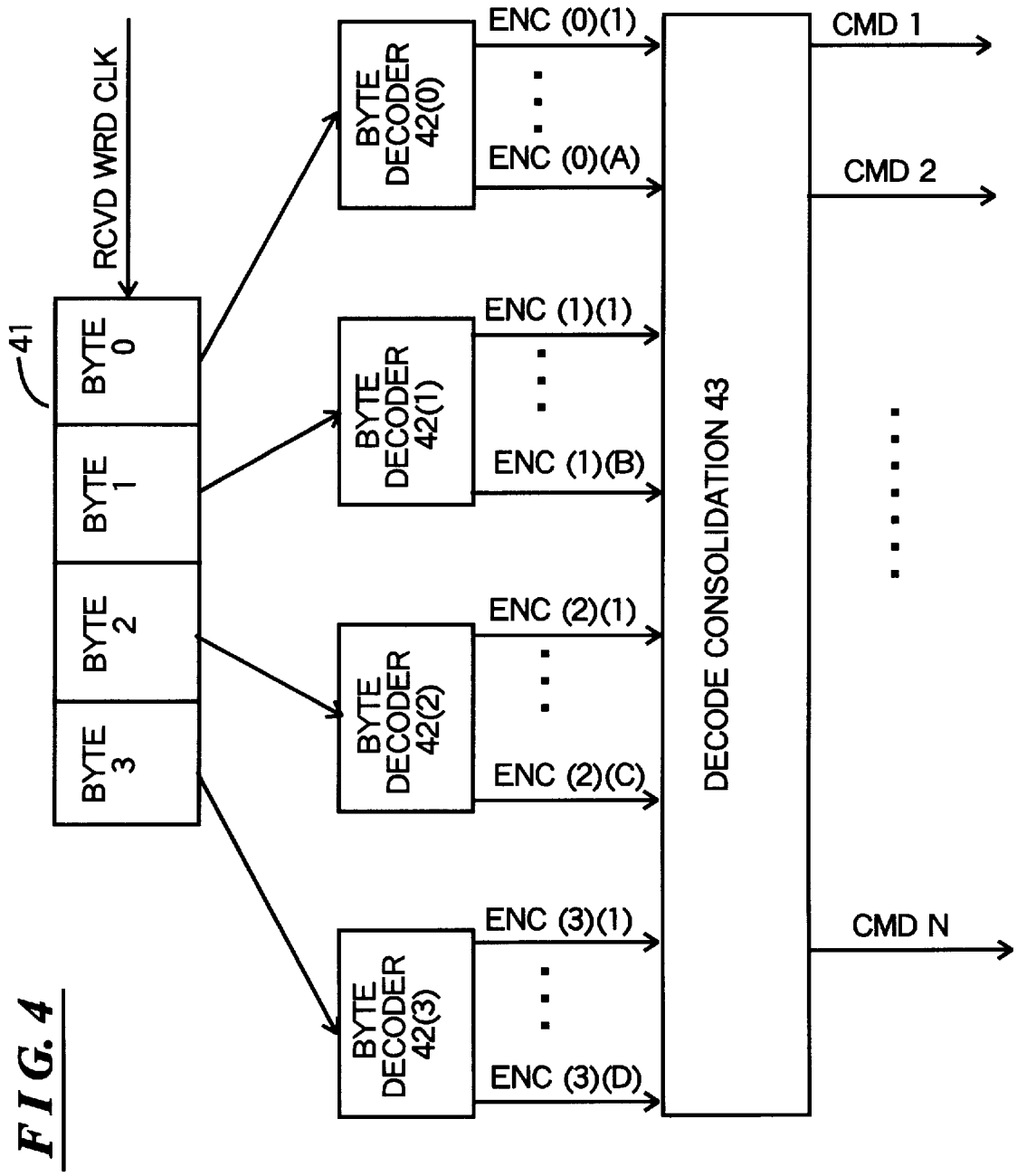
FIG. 4 depicts a schematic logic diagram of a command/control information decoding circuit for rapidly decoding a decoded word as received by a network device to identify the command/control information, if any, contained therein.
Figure 5:
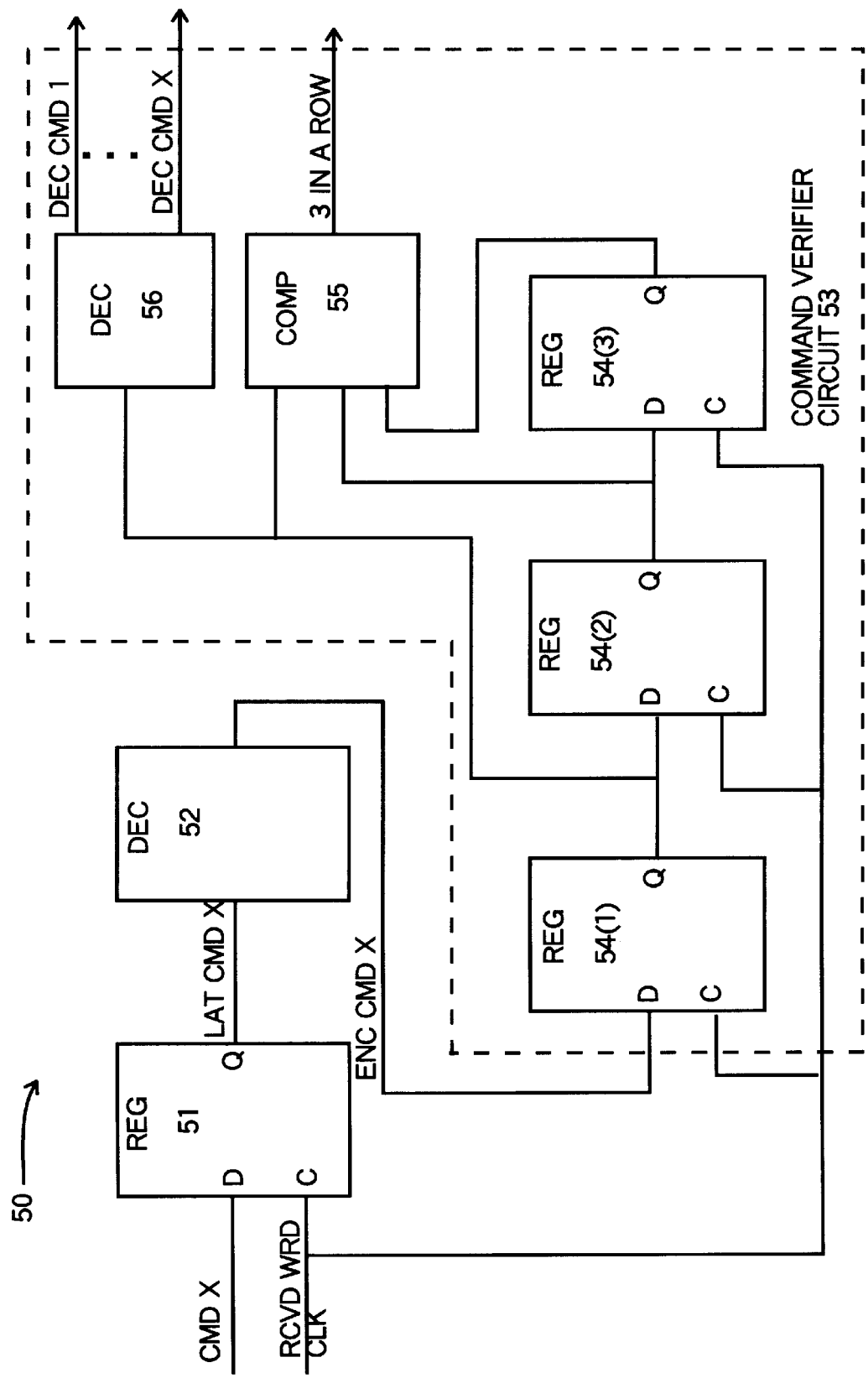
FIG. 5 depicts a schematic logic diagram of a command confirmation circuit for verifying that the command/control information has been received a selected number of successive times, facilitating control of processing of commands defined by the command/control information.

As described above, certain of the communications received by a network interface 14(n) will comprise data to be provided to the local computer 13(n) for processing, and command and control information for controlling the operation of the network interface 14(n) itself The commands constitute selected encodings of the thirty-two bit data words as provided by the decoder 30 (FIG. 3). The network interface 14(n) will recognize a number of types of commands each types being identified by a unique encoding in the thirty-two bit data word. As a further refinement, in one particular embodiment in which the network communications operate in accordance with the above-identified Fibre Channel network specification, a recipient computer system 11(n) will not recognize and process a command unless it is received a selected number of successive times, in one embodiment three times. That is, if the network interface 14(n), after receiving the same command/control information two successive times, then receives command/control information which is different, the network interface 14 will not process the command/control information even if the next command/control information corresponds to that previously received. This ensures that errors in signal transmission will not result in an interface 14 erroneously receiving and processing a command. FIG. 4 depicts a schematic logic diagram of a command/control information decoding circuit 40 for rapidly decoding a decoded word as received by the network interface 14(n) to identify the command/control information, if any, contained therein, and FIG. 5 depicts a schematic logic diagram of a command confirmation circuit 50 for verifying that the command/control information has been received the required number of successive times.

With reference to FIG. 4 the command/control information decoding circuit 40 includes an input register 41, a series of byte-wise decoder circuits 42(0) through 42(3) (generally identified by reference numeral 42(i)) and a decode consolidation circuit 43. The input register 41 receives the decoded thirty-two bit data word from the decoder 30 (FIG. 3) and latches it in response to a RCVD WORD CLK received word clock signal generated by the interface 14. For the thirty-two bit data word stored in the input register 41, each eight-bit byte, identified Byte 0 through Byte 3 (generally identified BYTE "i") is coupled to a correspondingly-indexed one of the byte-wise decoder circuits 42(i). Each byte-wise decoder circuit 42(i) decodes the respective byte BYTE "i" in input register 41 and asserts an ENC(i)(x) encode "x" signal for each of the bit patterns in the byte BYTE "i" which may constitute a command.

The command decode consolidation circuit 43, receives the ENC(i)(x) encode "x" signals from each of the byte decoders 42(i) and generates a single asserted output CMD X command "X" output signal in response. Thus, if a particular type "X" of command requires particular encodings in bytes 1 and 2, for example, the ENC(1)(x) and ENC(2)(x) encode signals will be asserted by byte decoders 42(1) and 42(2) if the data word in input register 41 defines the command, but no ENC(0)(x) or ENC(3)(x) signals will be asserted. In that case, the command decode consolidation circuit 43 will assert the CMD X signal, indicating reception of a data word defining the command X in response to the assertion of the ENC(1)(x) and ENC(2)(x) encode signals. It will be appreciated that, if the encoding of the byte BYTE 1 in input register 41 would indicate a particular command X, but the encoding of byte BYTE 2 would not, the ENC(1)(x) signal would be asserted, but the ENC(2)(x) signal would not be, in which case the command decode consolidation circuit 43 would maintain the CMD X signal in a negated condition. The command decode consolidation circuit 43 operates in a similar manner in connection with each of the various types of commands. Thus, the command decode consolidation circuit 43 operates to combine the command type identification contributions provided by each of the bytes BYTE "i" of the thirty-two bit data word in the input register 41 to identify the command defined by the data word.

By providing the command decode in several stages, namely, a byte decode stage comprising the byte decoders 42(i), followed by a consolidation stage comprising the command decode consolidation circuit 43, command decoding can be accomplished generally more quickly than if the bytes are decoded serially, and also more quickly and with fewer circuit elements than if, for example, full thirty-two bit decoders were provided for each of the possible thirty-two bit command patterns associated with each command.

As noted above, the network interface 14(n) will not recognize and process certain commands unless it has received the command a selected number of successive times, in one embodiment three times. FIG. 5 depicts a schematic logic diagram of a command confirmation circuit 50 for verifying that the command/control information has been received the required number of successive times. With reference to FIG. 5, the command confirmation circuit 50 includes an input register 51, a command encoder 52 and a command verifier circuit 53. The input register receives and stores the various CMD X command "X" signals from the decode consolidation circuit 43 (FIG. 4) in response to a tick of the RCVD WORD CLK received word clock signal from the interface 14. The input register 51 couples the stored signals as LAT CMD X stored command "X" signals to the command encoder 52.

The command encoder 52 receives the stored command signals LAT CMD X and generates encoded command signals ENC CMD X in response. In generating the encoded command signals, for each LAT CMD X stored command signal associated with a particular command "X," the command encoder 51 essentially treats the command identifier "X" as having an associated numerical value associated with "X" (such as LAT CMD 1, LAT CMD 2, and so forth), and the command encoder 52 will generate ENC CMD X signals corresponding to the binary-encoding of the numerical value for "X." Accordingly, if there are, for example, sixteen commands, such that the numerical values associated with the command identifier "X" can range from zero to fifteen, it will be appreciated the register 51 will provide sixteen stored command signals LAT CMD 0 through LAT CMD 15, all on separate connections, to the command encoder 52. In that illustration, the command encoder 52 will generate binary encoded ENC CMD X encoded command "X" signal which consists of a binary-encoding that can be provided on four lines.

The command verifier 53 includes a series of registers 54(1) through 54(3) (generally identified by reference numeral 54(t), a comparator 55 and a decoder 56. (While three registers 54(1) through 54(3) are depicted in FIG. 5, it will be appreciated from the following that the number of registers 54 will be determined by the number of successive commands required to enable the network interface 14 to initiate processing.) Register 54(1) is connected to latch the ENC CMD X encoded command "X" signal from the command encoder 52 in response to a tick of the RCVD WORD CLK received word clock signal. The registers 54(t) are connected in series so that, at successive clicks of the RCVD WORD CLK received word clock, register 54(1) stores the ENC CMD X signal from the command encoder, and the signals stored in registers 54(1) and 54(2) are shifted to registers 54(2) and 54(3), respectively. Thus, registers 54(t) include encoded command information, if any, for three words successively-received by the interface 14.

The outputs of the respective registers 54(t) are also connected to the comparator 55, which asserts a 3 IN A ROW signal if it determines that the registers 54(t) all have the same contents, which, it will be appreciated, will occur if three words successively-received by the interface 14 define the same command. In addition, the output of the register 54(1) is provided to the decoder 56, which performs a decoding operation which is complementary to the encoding operation performed by the command encoder 52 to generate individual DEC CMD X decoded command "X" command signals, in particular asserting the one of the decoded command signal identifying the command "X" defined by the ENC CMD X signal currently stored by the register 54(1). Accordingly, if the comparator 55 is asserting the 3 IN A ROW signal, the interface 14 will receive and use the DEC CMD X decoded command "X" command signals which the decoder 56 decodes from the ENC CMD X signal stored by the register 54(1).

The invention provides a number of advantages. In particular it provides arrangements for rapidly encoding data words for transmission over the communication links 12(p) and for receiving and decoding the encoded words which have been received from the respective communication links 12(p–1). In addition, it provides arrangements for quickly decoding the received data words to determine whether they identify commands and to verify command receipt when verification requires that the command be repeated a selected number of times.

While the interface 14(n), encoder 20, decoder 30, command/control information decoding circuit 40 and command confirmation circuit 50 have been described in connection with a network 10 comprising a plurality of computer systems 11(n) and other system devices interconnected by communication links 13(p), it will be appreciated that they may be used within a device or subsystem to interconnect various components within the subsystem. For example, they may be used in a mass storage subsystem including a system interface/controller and a number of storage devices such as disk or tape storage devices, for use in controlling transfers of control information and data between the system interface/controller and the storage devices.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

What is claimed as new and desired to be secured by Letters Patent of the United States is:

1. An encoding system for generating from an input data word an encoded data word, said input data word comprising a series of input data bytes and said encoded data word comprising a corresponding series of encoded data bytes, in accordance with a predetermined encoding methodology in which each encoded data byte is encoded in connection with the corresponding one of said input data bytes and an encoding control signal generated during encoding of a preceding input data byte in the series, the encoding control signal having at least two conditions, one of said conditions representative of a high disparity and a second of said conditions representative of a low disparity, the encoding system comprising a series of encoding sections each associated with a respective one of the input data bytes in the series, each encoding section including:

A. a plurality of encoding circuits each associated with one of the possible conditions of the encoding control signal, each encoding circuit receiving the associated one of the input data bytes and a signal corresponding to the one of the possible conditions of the encoding control signal associated therewith and generating therefrom an output encoded byte and an associated encoding control signal; and B. a selection circuit for receiving the output encoded bytes and associated encoding control signals generated by the encoding circuits of its associated encoding section, the selection circuit selectively providing, as an encoded data byte and a selected encoding control signal for the encoding section, the output encoded byte and associated encoding control signal from the one of its associated encoding circuits corresponding to the condition of the selected encoding control signal from a preceding one of the encoding sections in the series.

2. An encoding system as defined in claim 1, the encoding system generating from a series of input data words a corresponding series of encoded data words, each said input data word comprising a series of input data bytes from a low-order input data byte to a high-order input data byte, and each said encoded data word comprising a corresponding series of encoded data bytes, said encoding system further comprising a low-order encoding circuit for generating an encoded byte and an associated encoding control signal from a low-order one of the input data bytes and the encoding control signal generated for the high-order input data byte of a preceding input data word in the series.

3. An encoding system as defined in claim 2 in which the low-order encoding circuit further generates an encoding control signal for controlling the selection circuit of the first encoding section in said series of encoding sections.

4. An encoding method system as defined in claim 2 in which during the low-order encoding step, an encoding control signal is generated for controlling the selection step for the low-order encoded data byte in said series.

5. An encoding system as defined in claim 1 in which each encoding circuit generates an encoded data byte and encoding control signal in accordance with an 8b/10b encoding methodology, in which each encoding circuit generates from an eight-bit input data byte a ten-bit encoded data byte and encoding control signal.

6. A decoding system for generating from an encoded data word a decoded data word, said encoded data word comprising a series of encoded data bytes and said decoded data word comprising a corresponding series of decoded data bytes, in accordance with a predetermined decoding methodology in which each decoded data byte is generated in connection with the corresponding one of said encoded data bytes and a decoding control signal generated during decoding of a preceding encoded data byte in the series, the decoding control signal having at least two conditions, one of said conditions representative of a high disparity and a second of said conditions representative of a low disparity, the decoding system comprising a series of decoding sections each associated with a respective one of the encoded data bytes in the series, each decoding section including:

A. a plurality of decoding circuits each associated with one of the possible conditions of the decoding control signal, each decoding circuit receiving the associated one of the encoded data bytes and a signal corresponding to the one of the possible conditions of the decoding control signal associated therewith and generating therefrom an output decoded byte and an associated decoding control signal; and B. a selection circuit for receiving the output decoded bytes and associated decoding control signals generated by the decoding circuits of its associated decoding section, the selection circuit selectively providing, as a decoded data byte and a selected decoding control signal for the decoding section, the output decoded byte and associated decoding control signal from the one of its associated decoding circuits corresponding to the condition of the selected decoding control signal from a preceding one of the decoding sections in the series.

7. A decoding system as defined in claim 6, the decoding system generating from a series of encoded data words a corresponding series of decoded data words, each said encoded data word comprising a series of encoded data bytes from a low-order encoded data byte to a high-order encoded data byte, and each said decoded data word comprising a corresponding series of decoded data bytes, said decoding system further comprising a low-order decoding circuit for generating a decoded data byte and an associated decoding control signal from a low-order one of the encoded data bytes and the decoding control signal generated for the high-order encoded data byte of a preceding encoded data word in the series.

8. A decoding system as defined in claim 7 in which the low-order decoding circuit further generates a decoding control signal for controlling the selection circuit of the first decoding section in said series of decoding sections.

9. A decoding system as defined in claim 6 in which each decoding circuit generates a decoded data byte and decoding control signal in accordance with an 10b/8b decoding methodology, in which each decoding circuit generates from a ten-bit encoded data byte an eight-bit decoded data byte and decoding control signal.

10. An encoding method for generating from an input data word an encoded data word, said input data word comprising a series of input data bytes and said encoded data word comprising a corresponding series of encoded data bytes, in accordance with a predetermined encoding methodology in which each encoded data byte is encoded in connection with the corresponding one of said input data bytes and an encoding control signal generated during encoding of a preceding input data byte in the series, the encoding control signal having at least two conditions, one of said conditions representative of a high disparity and a second of said conditions representative of a low disparity the encoding method comprising the steps of A. generating, in parallel, for a respective one of the input data bytes in the series, from one of the input data bytes and a signal corresponding to the one of the possible conditions of the encoding control signal associated therewith, an output encoded byte and an associated encoding control signal; and B. selecting, as an encoded data byte and a selected encoding control signal for the encoding section, the output encoded byte and associated encoding control signal from the one of its associated encoding circuits corresponding to the condition of the selected encoding control signal selected for a preceding one of encoded data bytes in the series.

11. An encoding method as defined in claim 10, the encoding system generating from a series of input data words a corresponding series of encoded data words, each said input data word comprising a series of input data bytes from a low-order input data byte to a high-order input data byte, and each said encoded data word comprising a corresponding series of encoded data bytes, said encoding method further comprising the step of generating an encoded byte and an associated encoding control signal from a low-order one of the input data bytes and the encoding control signal generated for the high-order input data byte of a preceding input data word in the series.

12. An encoding system as defined in claim 10 in which, during the encoding step, an encoded data byte and encoding control signal are generated in accordance with an 8b/10b encoding methodology, in which, from an eight-bit input data byte, a ten-bit encoded data byte and encoding control signal are generated.

13. A decoding method for generating from an encoded data word a decoded data word, said encoded data word comprising a series of encoded data bytes and said decoded data word comprising a corresponding series of decoded data bytes, in accordance with a predetermined encoding methodology in which each decoded data byte is decoded in connection with the corresponding one of said encoded data bytes and a encoding control signal generated during encoding of a preceding decoded data byte in the series, the encoding control signal having at least two conditions, one of said conditions representative of a high disparity and a second of said conditions representative of a low disparity, the encoding method comprising the steps of A. generating, in parallel, for a respective one of the encoded data bytes in the series, from one of the encoded data bytes and a signal corresponding to the one of the possible conditions of the decoding control signal associated therewith, an output decoded data byte and an associated decoding control signal; and B. selecting, as a decoded data byte and a selected decoding control signal for the decoding section, the output decoded byte and associated decoding control signal from the one of its associated decoding circuits corresponding to the condition of the selected decoding control signal selected for a preceding one of decoded data bytes in the series.

14. A decoding method as defined in claim 13, the decoding system generating from a series of encoded data words a corresponding series of encoded data words, each said encoded data word comprising a series of encoded data bytes from a low-order encoded data byte to a high-order encoded data byte, and each said encoded data word comprising a corresponding series of encoded data bytes, said decoding method further comprising the step of generating an encoded byte and an associated decoding control signal from a low-order one of the encoded data bytes and the decoding control signal generated for the high-order encoded data byte of a preceding encoded data word in the series.

15. A decoding method system as defined in claim 14 in which during the low-order decoding step, a decoding control signal is generated for controlling the selection step for the low-order decoded data byte in said series.

16. A decoding system as defined in claim 13 in which, during the decoding step, a decoded data byte and decoding control signal are generated in accordance with an 8b/10b decoding methodology, in which, from an eight-bit encoded data byte, a ten-bit decoded data byte and decoding control signal are generated.

* * * * *